United States Patent
Lo et al.

(10) Patent No.: US 9,263,650 B2
(45) Date of Patent: Feb. 16, 2016

(54) EPITAXIAL SUBSTRATE, LIGHT-EMITTING DIODE, AND METHODS FOR MAKING THE EPITAXIAL SUBSTRATE AND THE LIGHT-EMITTING DIODE

(71) Applicant: Aceplux Optotech Inc., Tainan (TW)

(72) Inventors: Hsin-Ming Lo, Pingtung County (TW); Shih-Chang Shei, Tainan (TW)

(73) Assignee: Aceplux Optotech Inc., Tainan (TW)

( * ) Notice: Subject to any disclaimer, the term of this patent is extended or adjusted under 35 U.S.C. 154(b) by 34 days.

(21) Appl. No.: 14/147,931

(22) Filed: Jan. 6, 2014

(65) Prior Publication Data

US 2014/0117398 A1 May 1, 2014

Related U.S. Application Data

(62) Division of application No. 13/406,023, filed on Feb. 27, 2012, now abandoned.

(30) Foreign Application Priority Data

May 31, 2011 (TW) .............................. 100119057 A (51) Int. Cl.
| | | |
|---|---|---|
| *H01L 21/00* | (2006.01) | |
| *H01L 33/58* | (2010.01) | |
| *H01L 33/00* | (2010.01) | |
| *H01L 33/12* | (2010.01) | |

(52) U.S. Cl.
CPC .............. *H01L 33/58* (2013.01); *H01L 33/007* (2013.01); *H01L 33/12* (2013.01)

(58) Field of Classification Search
CPC ......... H01L 33/58; H01L 33/32; H01L 3/007; H01L 33/12; H01L 33/10; H01L 33/20; H01L 33/22; H01L 33/38
USPC ............ 257/77, 98, 103, E33.015, 13, 53, 79, 257/88; 438/29, 116
See application file for complete search history.

(56) References Cited

U.S. PATENT DOCUMENTS

| | | | |
|---|---|---|---|
| 8,502,190 B2 | 8/2013 | Liu et al. | |
| 2002/0071963 A1* | 6/2002 | Fujii | ...................... C07C 211/54 428/690 |
| 2004/0113166 A1 | 6/2004 | Tadatomo et al. | |
| 2010/0075452 A1* | 3/2010 | Lee | ......................... H01L 33/007 438/47 |
| 2010/0224858 A1* | 9/2010 | Tu | ........................ H01L 33/642 257/13 |

* cited by examiner

*Primary Examiner* — Jarrett Stark
*Assistant Examiner* — Shahed Ahmed
(74) *Attorney, Agent, or Firm* — Frommer Lawrence & Haug LLP (57) ABSTRACT

An epitaxial substrate includes: a base member; and a plurality of spaced apart light-transmissive members, each of which is formed on and tapers from an upper surface of the base member, and each of which is made of a light-transmissive material having a refractive index lower than that of the base member. A light-emitting diode having the epitaxial substrate, and methods for making the epitaxial substrate and the light-emitting diode are also disclosed.

10 Claims, 7 Drawing Sheets

EPITAXIAL SUBSTRATE, LIGHT-EMITTING DIODE, AND METHODS FOR MAKING THE EPITAXIAL SUBSTRATE AND THE LIGHT-EMITTING DIODE

CROSS-REFERENCE TO RELATED APPLICATION

This application is a division of U.S. patent application Ser. No. 13/406,023 filed Feb. 27, 2012 which claims priority of Taiwanese application no. 100119057, filed on May 31, 2011, the disclosures of both are incorporated herein by reference.

BACKGROUND OF THE INVENTION

1. Field of the Invention

This invention relates to an epitaxial substrate, a light-emitting diode, and methods for making the epitaxial substrate and the light-emitting diode, more particularly to an epitaxial substrate having light-transmissive members, a light-emitting diode having the epitaxial substrate, and methods for making the epitaxial substrate and the light emitting diode.

2. Description of the Related Art

Figure 1:
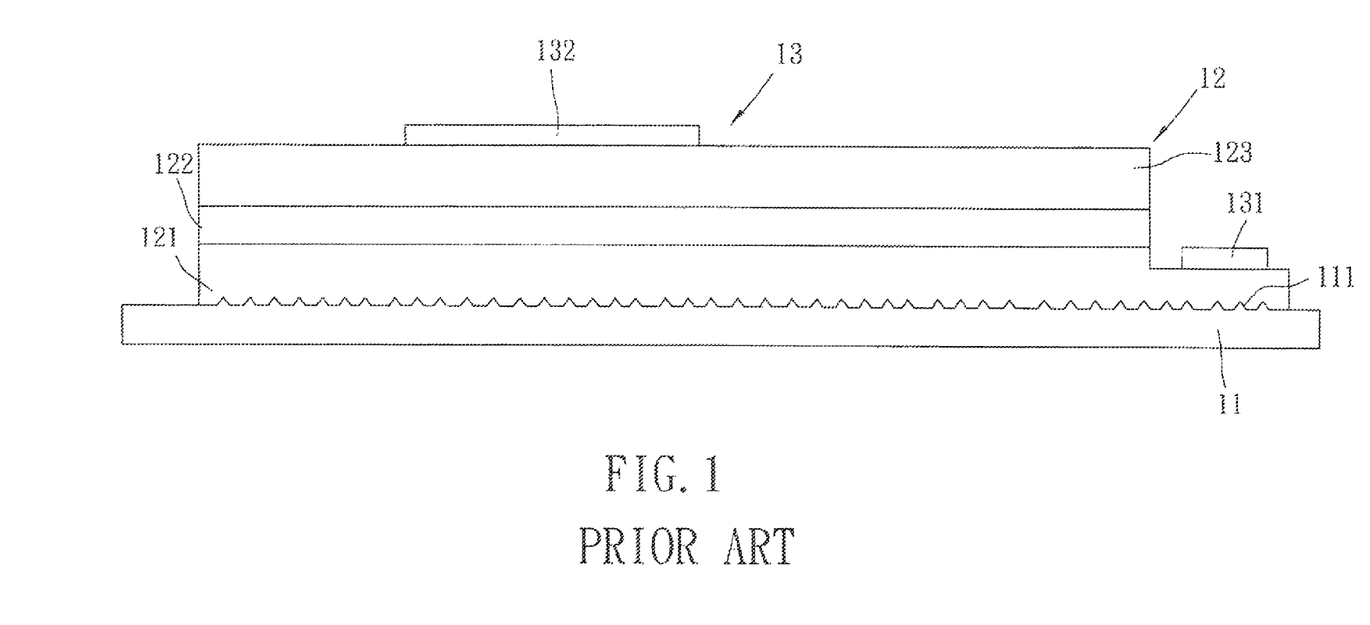
FIG. 1 is a schematic diagram of a conventional light-emitting diode.

Referring to FIG. 1, a conventional light-emitting diode (LED) includes an epitaxial substrate 11, a light-emitting unit 12, and an electrode unit 13. The epitaxial substrate 11 has a rough structure 111 formed thereon. The light-emitting unit 12 includes a first-type semiconductor layer 121 formed on the rough structure 111 of the epitaxial substrate 11, a light-emitting layer 122 formed on a portion of the first-type semiconductor layer 121, and a second-type semiconductor layer 123 formed on the light-emitting layer 122. The electrode unit 13 includes a first electrode 131 electrically connected to the first-type semiconductor layer 121, and a second electrode 132 electrically connected to the second-type semiconductor layer 123. When electricity is supplied to the light-emitting unit 12 through the first and second electrodes 131, 132, the light-emitting unit 12 will emit light by virtue of the photovoltaic effect. After the light from the light-emitting layer 122 travels to the rough structure 111 of the epitaxial substrate 11, it may be reflected or refracted so as to vary the travelling direction of the light to emit the light outwardly, thereby enhancing the light extraction efficiency of the LED.

In the conventional LED, the epitaxial substrate 11 and the rough structure 111 are made of the same material, and the rough structure 111 is usually made by roughening or patterning an upper surface of the epitaxial substrate 11 using an etching process. However, the epitaxial substrate 11 for the LED is commonly made of silicon, silicon carbide, aluminum oxide, etc., and is difficult to be etched. Accordingly, the etching process is time-consuming. Beside, the rough structure 111 may have poor dimensional accuracy, thereby resulting in uneven luminance of the LED.

SUMMARY OF THE INVENTION

Therefore, an object of the present invention is to provide an epitaxial substrate, a light-emitting diode, and methods making the epitaxial substrate and the light-emitting diode, which can overcome the aforesaid drawbacks associated with the prior art.

According to a first aspect of this invention, an epitaxial substrate comprises:
a base member; and
a plurality of spaced apart light-transmissive members, each of which is formed or and tapers from an upper surface of the base member, and each of which is made of a light-transmissive material having a refractive index lower than that of the base member.

According to a second aspect of this invention, a method for making an epitaxial substrate comprises:
(a) forming over a base member a light-transmissive layer that is made of a light-transmissive material having a refractive index lower than that of the base member;
(b) forming a patterned mask over the light-transmissive layer;
(c) heat-treating the patterned mask at a temperature not higher than a glass transition temperature of the patterned mask;
(d) performing a dry-etching treatment on the light-transmissive layer and the patterned mask that is heat-treated, so that the light-transmissive layer is formed into a plurality of spaced apart light-transmissive members; and
(e) removing the patterned mask from the light-transmissive members.

According to a third aspect of this invention, a light-emitting diode comprises:
an epitaxial substrate including a base member, and a plurality of spaced apart light-transmissive members, each of which is formed on and tapers from an upper surface of the base member, and each of which is made of a light-transmissive material having a refractive index lower than that of the base member; and
a light-emitting unit formed on the epitaxial substrate to cover the light-transmissive members.

According to a fourth aspect of this invention, a method for making a light emitting diode comprises:
(a) forming over a base member a light-transmissive layer that is made of a light-transmissive material having a refractive index lower than that of the base member;
(b) forming a patterned mask over the light-transmissive layer;
(c) heat-treating the patterned mask at a temperature not higher than a glass transition temperature of the patterned mask;
(d) performing a dry-etching treatment on the light-transmissive layer and the patterned mask that is heat-treated, so that the light-transmissive layer is formed into a plurality of spaced apart light-transmissive members, followed by removing the patterned mask from the light-transmissive members; and
(e) forming a light-emitting unit over the light-transmissive members.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 2:
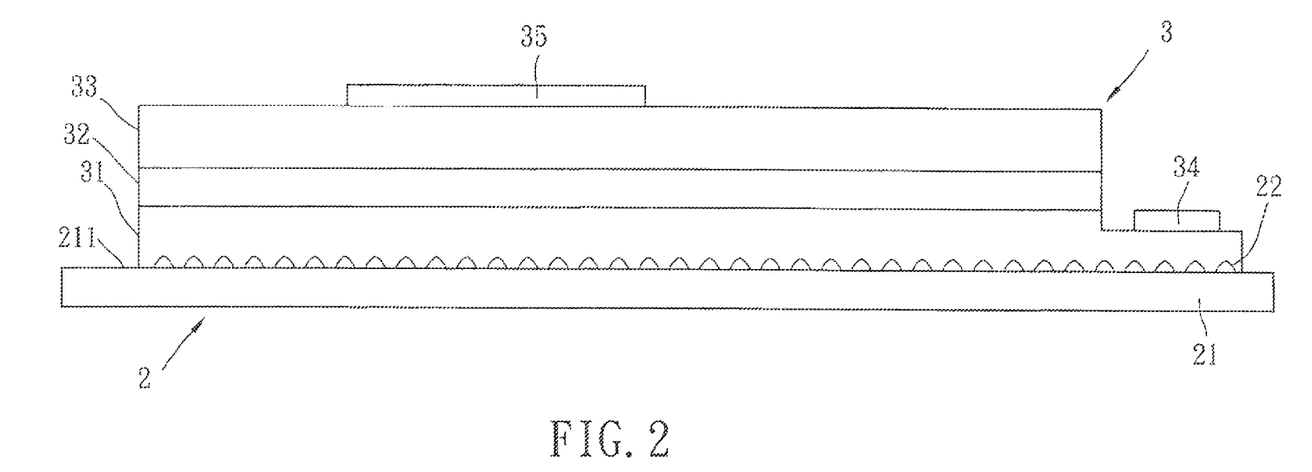
FIG. 2 is a schematic diagram of the preferred embodiment of a light-emitting diode according to this invention.

Referring to FIG. 2, the preferred embodiment of a light-emitting diode (LED) according to this invention includes an epitaxial substrate 2 and a light-emitting unit 3.

The epitaxial substrate 2 includes a base member 21 and a plurality of spaced apart light-transmissive members 22 that serve as a rough structure of the epitaxial substrate 2. The base member 21 has an upper surface 211, and is made from a material selected from the group consisting of silicon, aluminum oxide, silicon carbide, and aluminum nitride. Each of the light-transmissive members 22 is formed on and tapers from the upper surface 211 of the base member 21, and is made of light-transmissive material having a refractive index lower than that of the base member 21. The light-transmissive material is selected from the group consisting of silicon oxide ($SiO_x$), silicon oxynitride ($SiON_x$), and magnesium fluoride ($MgF_2$). The silicon oxide and the magnesium fluoride are preferable.

Figure 3:
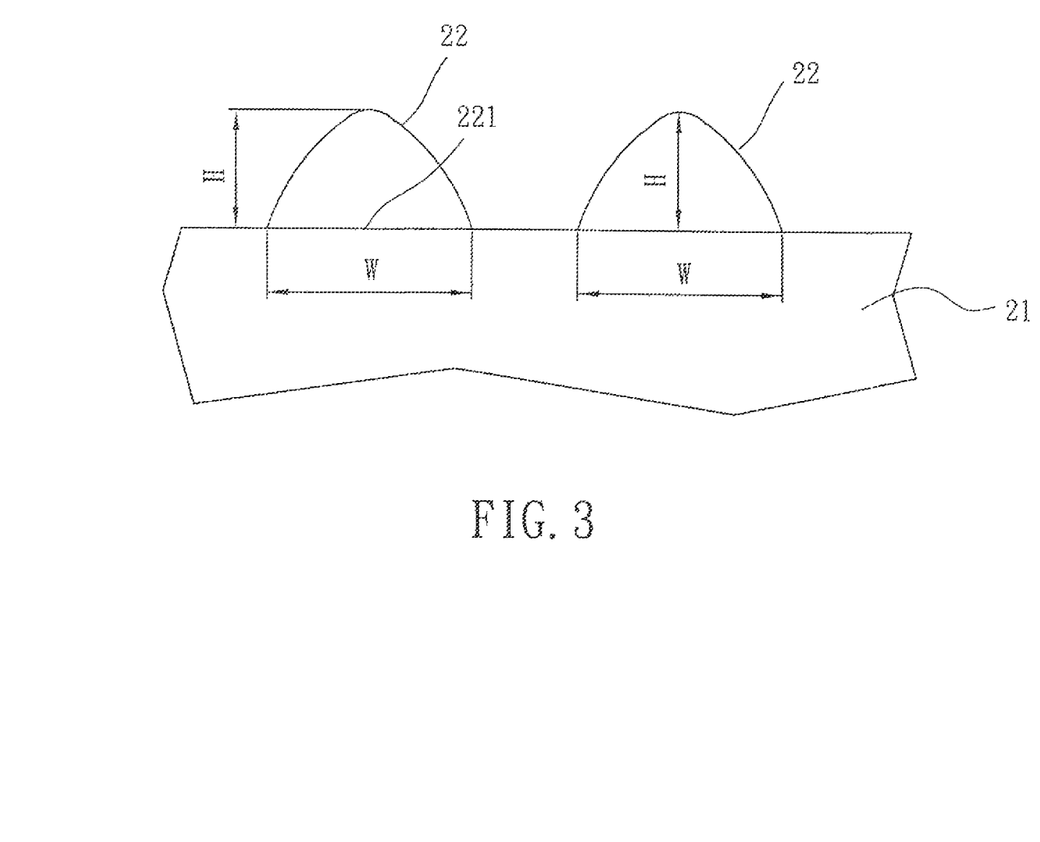
FIG. 3 is a fragmentary enlarged diagram of the preferred embodiment of an epitaxial substrate according to this invention.

Referring to FIG. 3, each of the light-transmissive members 22 is in a cone-shape, and has a bottom face 221 and a height (H) from the bottom face 221. The bottom face 221 contacts the upper surface 211 of the base member and has a maximum width (W). With the light-transmissive member 22 in the cone-shape, the traveling direction of the light can be easily changed. When a ratio of the height (H) to the maximum width (W) is too small, the height (H) of the light-transmissive members 22 is insufficient so that the incident angle of light may be too large, thereby reducing the light extraction efficiency. Accordingly, the ratio of the height (H) to the maximum width (W) is preferably not less than 0.25. It should be noted that in this specification, the incident angle of the light means an angle between a light incident on a surface of the light-transmissive member 22 and a tangent line of the surface at the point of light incidence.

Referring back to FIG. 2, the light-emitting unit 3 includes a first-type semiconductor layer 31 that is connected to the base member 21 and the light-transmissive members 22, a light-emitting layer 32 that is formed on a portion of the first-type semiconductor layer 31, a second-type semiconductor layer 33 that is formed on the light-emitting layer 32 and that has an electrical property opposite to that of the first type semiconductor layer 31, a first electrode 34 that is formed on the first-type semiconductor layer 31, and a second electrode 35 that is formed on the second-type semiconductor layer 33. When electricity is applied to the light-emitting layer 32 through the first and second electrodes 34, 35, the light-emitting layer 32 emits light by virtue of the photovoltaic effect. After the light from the light-emitting layer 32 travels to the base member 21 and the light-transmissive members 22, it may be reflected or refracted so as to vary the travelling direction of the light and to emit the light outwardly, thereby enhancing the light extraction efficiency of the LED of this invention. Since the materials for forming the light-emitting unit 3 are well-known in the art, detailed descriptions thereof are omitted herein for the sake of brevity.

Simulation experiments were conducted to determine the relationship between, height of the rough structure and light extraction efficiency ratio in the LED of this invention and the conventional LED. The results are shown in FIG. 4.

Concerning the simulation parameters for the LED of this invention (FIG. 2), the base member 21 is made of sapphire, the rough structure (i.e., the light-transmissive members 22) is made of silicon oxide, the maximum width (W) of the bottom face 221 in each of the light-transmissive members 22 is controlled at 4 μm, and the current applied to the LED is controlled at 20 mA.

As to the simulation parameters for the conventional LED (FIG. 1) the epitaxial substrate 11 is made of sapphire (i.e., the rough structure 111 is also made of sapphire), and the current applied to the LED is controlled at 20 mA.

Figure 4:
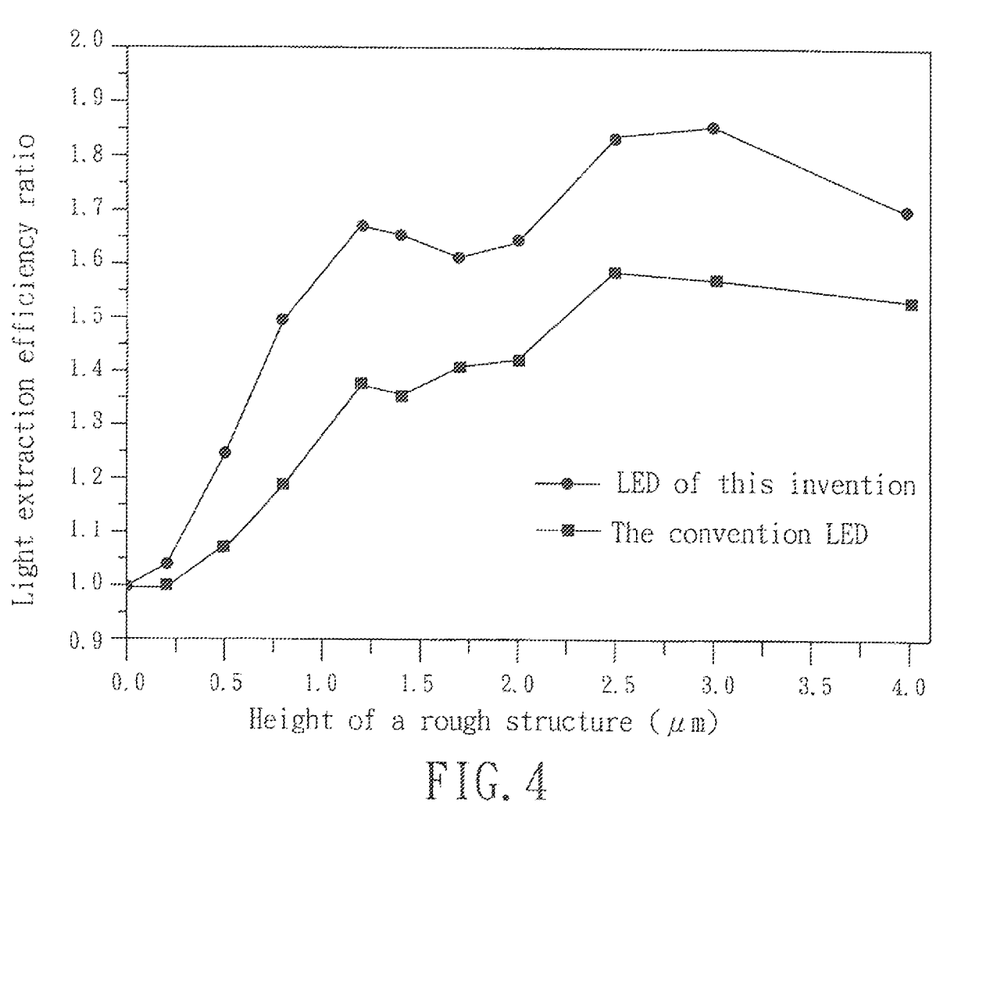
FIG. 4 illustrates relations between a light extraction efficiency ratio and a height of a rough structure of the light-emitting diodes shown in FIGS. 1 and 2.

The simulation results are shown in FIG. 4. In this specification, the term "a light extraction efficiency" means a ratio of the amount of light emitted by the LED to the amount of light generated by the LED, and the term "a light extraction efficiency ratio" means a ratio of the light extraction efficiency of the LED having the rough structure to the light extraction efficiency of the LED without the rough structure.

From FIG. 4, it is found that, by virtue of use of the material having a refractive index lower than that of the base member in the light-transmissive members, the light extract ion efficiency ratio of the LED according to this invention is greater than that of the conventional LED by about 20%. In addition, by controlling the height of the rough structure, i.e., the H/W ratio of the rough structure, a desired light extraction efficiency can be obtained. In sum, by controlling the refractive index and H/W ratio of the light-transmissive member, the light from the light-emitting layer 32 toward the base member 21 may travel to and be efficiently refracted twice and reflected by the light-transmissive members 22 to emit outwardly. Thus, the light extraction efficiency of the LED of this invention can be effectively improved.

Besides, when the ratio of the height (H) to the maximum width (W) is not less than 0.25 (i.e., the height (H) in FIG. 4 is not less than 1.0 μm), each of the light-transmissive members 22 has a relatively large curvature. Thus, a light incident at different points on the light-transmissive members 22 may have different incident angles, and may be reflected to travel in different directions, thereby further enhancing the light extraction efficiency (ratio) of the LED compared to the conventional LED. Accordingly, the ratio of the height (H) to the maximum width (W) preferably ranges between 0.25 and 1.0, more preferably between 0.6 and 1.0.

Furthermore, by increasing the density of the light-transmissive members 22, the light can be reflected and refracted more efficiently. Preferably, the light-transmissive members 22 are spaced apart from one another by a distance not greater than 1 μm.

Figure 5:
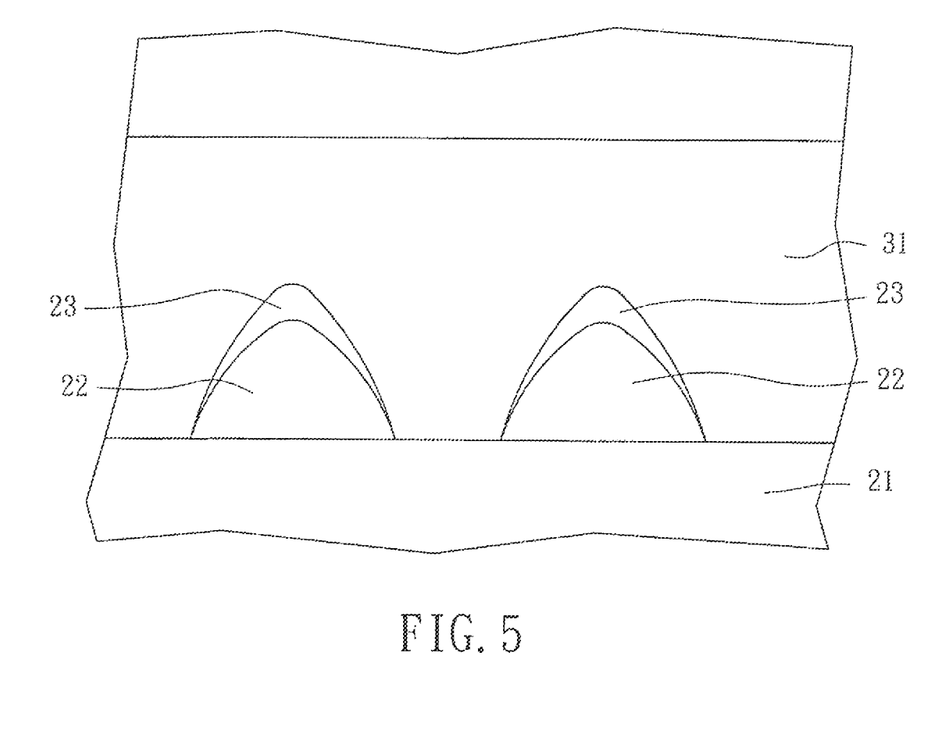
FIG. 5 is a fragmentary enlarged diagram of another preferred embodiment of a light-emitting diode according to this invention.

In another preferred embodiment, the first-type semiconductor layer 31 of the light-emitting unit 3 and the light-transmissive members 22 cooperatively define at least one cavity 23 therebetween (see FIG. 5). With the cavity 23, a relatively large refractive index difference is formed between the cavity 23 and the first-type semiconductor layer 31, and thus, the light traveling toward the base member 21 may be easily reflected to emit outwardly.

Figure 6:
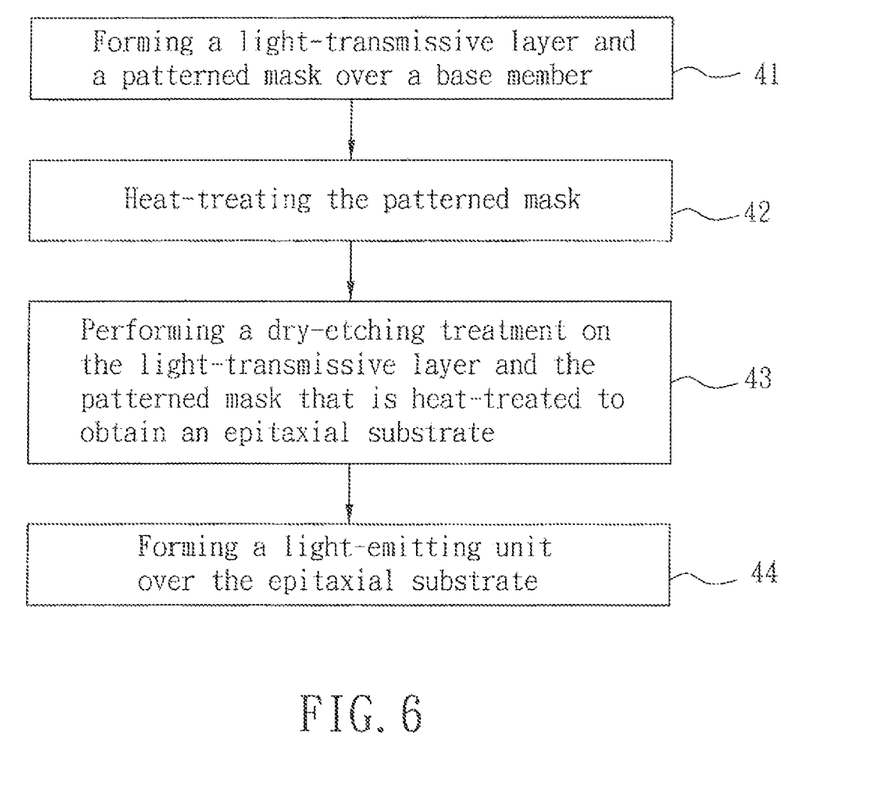
FIG. 6 is a flow chart showing the preferred embodiment of a method for making the light-emitting diode according to this invention.
Figure 7:
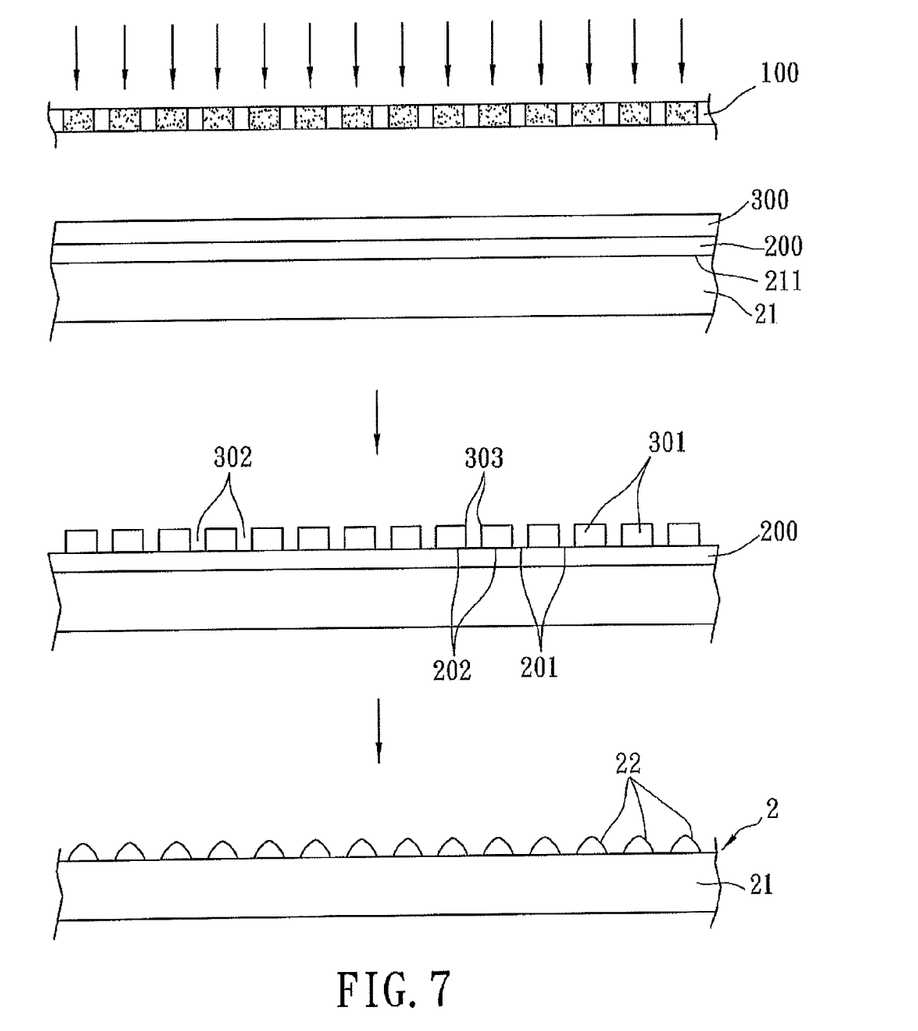
FIG. 7 is a flow diagram illustrating consecutive steps of the method shown in FIG. 6.

Referring to FIGS. 6 and 7, the preferred embodiment of a method for forming the light emitting diode according to this invention comprises the following steps.

In step 41, a light-transmissive layer 200 is formed over a base member 21 using a chemical vapor deposition process, a mask layer 300 is formed over the light-transmissive layer 200, and the mask layer 300 is patterned by a lithography process to form mask segments 303, displaced from one another in a longitudinal direction by a plurality of gaps 302, using a patterned photomask 100 to obtain a patterned mask 301 that partially exposes the light-transmissive layer 200 as a plurality of first regions 201. The mask segments 303 are super-imposed on second regions 202. Since the chemical vapor deposition process and the lithography process are well-known in the art, detailed to descriptions thereof are omitted herein for the sake of brevity.

Based on process requirements, the mask layer 300 can be made of positive-type or negative-type photoresist material. In this embodiment, the mask layer 300 is made of the positive-type photoresist material. The light-transmissive layer 200 is made of light-transmissive material having a refractive index lower than that of the base member 21, such as silicon oxide ($SiO_x$), silicon oxynitride ($SiON_x$), and magnesium fluoride ($MgF_2$). In consideration of the subsequent high-temperature process for forming a light-emitting unit 3, the light-transmissive material preferably has a heat resistivity of not less than 1000° C. That is to say, the refractive index and the light transmittance of the light-transmissive material would not be significantly changed at a temperature of not less than 1000° C. In practice, the light-transmissive material will not be processed at a temperature greater than 1200° C. Besides, the light-transmissive material preferably has the refractive index lower than both of the base member 21 and the first-type semiconductor layer 31, and thus, is preferably made of silicon oxide ($SiO_x$) or magnesium fluoride ($MgF_2$).

In step 42, the patterned mask 301 is heat-treated at a temperature not higher than a glass transition temperature (Tg) of the patterned mask 301, and is preferably heat-treated at a temperature of about 5° C. to 10° C. lower than the Tg of the patterned mask 301 for about 60 minutes. At such temperature, molecular chain movement inside the patterned mask 301 occurs so that the patterned mask 301 is deformed to have a plurality of arch-shaped structures each of which is in a state of its lowest surface energy.

In step 43, a dry-etching treatment is performed to anisotropically etch the light-transmissive layer 200 and the patterned mask 301 that is heat-treated, so that the light-transmissive layer 200 is formed into a plurality of spaced apart light-transmissive members 22. Thereafter, the patterned mask 301 is fully removed from the light-transmissive members 22, thereby obtaining an epitaxial substrate 2 that has the base member 21 and the light-transmissive members 22.

In the dry-etching treatment, the radio frequency power ranges from about 200 W to 400 W, and the etching gas may be fluorine-containing gas, such as $CF_4$, $SF_6$, $CHF_3$, etc. In this step, an etching ratio of the light-transmissive layer 200 to the pattered mask 301 preferably ranges from 1:0.5 to 1:1.5.

In step 44, a light-emitting unit 3 is formed over the light-transmissive members 22.

In this step, a metal organic chemical vapor deposition (MOCVD) process is conducted, and includes the following substeps (1) forming a first-type semiconductor layer 31 over the base member 21 and the light-transmissive members 22, (2) forming a light-emitting layer 32 on a portion of the first-type semiconductor layer 3, (3) forming a second-type semiconductor layer 33 over the light-emitting layer 32, and (4) forming first and second electrodes 34, 35 respectively on the first-type semiconductor layer 31 that is exposed and the second-type semiconductor layer 33. In this step, the material selection and the MOCVD process are well-known in the art, and detailed descriptions thereof are omitted herein for the sake of brevity.

In should be noted that, when forming the first-type semiconductor layer 31 in step 44, at least one cavity 23 (see FIG. 5) may be formed between the first-type semiconductor layer 31 and the light-transmissive members 22 if the epitaxial parameters, such as background gas composition, pressure, temperature, etc, are well-controlled.

By the method of this invention, the etching problem for the epitaxial substrate can be eliminated, and thus, the processing time for making the LED of this invention can be reduced. Besides, the method of this invention is relatively simple, and the uniformity and the dimensional accuracy of the light-transmissive members 22 can be easily controlled. As such, the LED made by the method of this invention can emit light evenly.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for making an epitaxial substrate, comprising:
    (a) forming a light-transmissive layer on a flat upper surface of a base member, the light-transmissive layer being made of a light-transmissive material having a refractive index lower than that of the base member;
    (b) forming a mask layer on the light-transmissive layer, the mask layer being made of a photoresist material;
    (c) patterning the mask layer to obtain a patterned mask constituted by a plurality of mask segments which are displaced from one another in a longitudinal direction by a plurality of gaps that expose a plurality of first regions of the light-transmissive layer from the patterned mask, and which are superimposed upon a plurality of second regions of the light-transmissive layer, respectively, each of the mask segments having at least a corner edge;
    (d) heat-treating the patterned mask at a temperature close to a glass transition temperature of the photoresist material such that the corner edge of each of the mask segments is rounded so as to permit each of the mask segments to acquire a cone-shaped profile; and
    (e) subjecting the exposed first regions and the heat-treated patterned mask to a dry-etching treatment, such that the first regions and the heat-treated patterned mask are removed, therein permitting each of the second regions left on the base member to have a profile similar to the cone-shaped profile.

2. The method of claim 1, wherein each of the light-transmissive members has a bottom face that contacts an upper surface of the base member and that has a maximum width, and a height from the bottom face, a ratio of the height to the maximum width being not less than 0.25, two adjacent ones of the light-transmissive members being spaced apart from each other by a distance not greater than 1 μm.

3. The method of claim 1, wherein the light-transmissive material has a heat resistivity of not less than 1000° C.

4. The method of claim 1, wherein the light-transmissive material is selected from the group consisting of silicon oxide, silicon oxynitride, and magnesium fluoride.

5. The method of claim 1, wherein the base member is made from a material selected from the group consisting of aluminum oxide, silicon carbide, silicon, and aluminum nitride.

6. A method for making a light-emitting diode, comprising:
    (a) forming a light-transmissive layer on a flat upper surface of a base member, the light-transmissive layer being made of a light-transmissive material having a refractive index lower than that of the base member;
    (b) forming a mask layer on the light-transmissive layer, the mask layer being made of a photoresist material;
    (c) patterning the mask layer to obtain a patterned mask constituted by a plurality of mask segments which are displaced from one another in a longitudinal direction by a plurality of gaps that expose a plurality of first regions of the light-transmissive layer from the patterned mask, and which are superimposed upon a plurality of second regions of the light-transmissive layer, respectively, each of the mask segments having at least a corner edge;

(d) heat-treating the patterned mask at a temperature close to a glass transition temperature of the photoresist material such that the corner edge of each of the mask segments is rounded so as to permit each of the mask segments to acquire a cone-shaped profile; and (e) subjecting the exposed first regions and the heat-treated patterned mask to a dry-etching treatment, such that the first regions and the heat-treated patterned mask are removed, therein permitting each of the second regions left on the base member to have a profile similar to the cone-shaped profile, so as to obtain a plurality of light-transmissive members on the base member;

(f) epitaxially growing a first-type semiconductor layer from the base member such that the first-type semiconductor layer is superimposed on the base member and the light-transmissive members;

(g) epitaxially growing a light-emitting layer on the first semiconductor layer; and (h) epitaxially growing a second-type semiconductor layer on the light-emitting layer.

7. The method of claim 6, wherein each of the light-transmissive members has a bottom face that contacts an upper surface of the base member and that has a maximum width, and a height from the bottom face, a ratio of the height to the maximum width being not less than 0.25, two adjacent ones of the light-transmissive members being spaced apart from each other by a distance not greater than 1 µm.

8. The method of claim 6, wherein in step (e), when the first-type semiconductor layer is being epitaxially grown from the base member, at least one cavity is formed between the light-transmissive members and the first-type semiconductor layer.

9. The method of claim 6, wherein the base member is made from a material selected from the group consisting of aluminum oxide, silicon carbide, silicon, and aluminum nitride.

10. The method of claim 6, wherein the light-transmissive material is selected from the group consisting of silicon oxide, silicon oxynitride, and magnesium fluoride.

* * * * *